US005714721A

United States Patent [19]

Gawronski et al.

[11] Patent Number: 5,714,721

[45] **Date of Patent: *Feb. 3, 1998**

[54] PORTING

[75] Inventors: Brian J. Gawronski, Northboro; Gerald F. Caron, Andover, both of Mass.

[73] Assignee: Bose Corporation, Framingham, Mass.

[ * ] Notice: The term of this patent shall not extend beyond the expiration date of Pat. No. 5,092,424.

[21] Appl. No.: 739,300

[22] Filed: Oct. 29, 1996

Related U.S. Application Data

[63] Continuation of Ser. No. 843,858, Feb. 27, 1992, abandoned, which is a continuation-in-part of Ser. No. 621,531, Dec. 3, 1990, Pat. No. 5,092,424.

[51] Int. Cl.[6] .......... H05K 5/00

[52] U.S. Cl. .......... 181/156; 181/145; 181/148; 181/199

[58] Field of Search .......... 181/144, 145, 181/148, 156, 199, 150; 381/159

[56] References Cited

U.S. PATENT DOCUMENTS

| | | | |
|---|---|---|---|
| 2,900,040 | 8/1959 | Novak | 181/152 |
| 3,142,353 | 7/1964 | Todisco | 181/145 |
| 4,206,831 | 6/1980 | Welch et al. | 181/159 |
| 4,213,515 | 7/1980 | Laupman | 181/145 |
| 4,301,332 | 11/1981 | Dusanoek | 181/144 |
| 4,549,631 | 10/1985 | Bose | 181/156 X |
| 4,596,305 | 6/1986 | Jagborn | 181/151 |
| 4,790,408 | 12/1988 | Adair | 181/144 |
| 4,869,340 | 9/1989 | Coudoux | 181/146 |
| 4,875,546 | 10/1989 | Krnan | 181/150 X |
| 4,964,482 | 10/1990 | Meyer | 181/146 |
| 5,067,583 | 11/1991 | Hathaway | 181/151 |
| 5,092,424 | 3/1992 | Schreiber et al. | 181/145 |
| 5,109,422 | 4/1992 | Furukawa | 381/96 |

OTHER PUBLICATIONS

Fluid Mechanics. Viscous Flow in Ducts, pp. 335–336, 348, 360–365, 404–411.

Lyle F. Yerges, "Sound, Noise, and Vibration Control" Sep. 1969, pp. 33–69.

*Primary Examiner*—Eddie C. Lee
*Attorney, Agent, or Firm*—Fish & Richardson P.C.

[57] ABSTRACT

A loudspeaker enclosure has an inside volume. At least one port characterized by predetermined mass intercouples the inside volume and the region outside the enclosure. Each port has a smoothly flared input end within the inside volume and smoothly flared output end adjacent to the region outside the inside volume. The port defines a boundary between the acoustic mass therein and the inside volume, the boundary typically being defined by an ellipse, and in a particular form by the rotation of an ellipse about the axis of a port. Typically, the length of the port corresponds substantially to the major diameter of the ellipse.

6 Claims, 2 Drawing Sheets

PORTING

This is a continuation of application Ser. No. 07/843,858, filed Feb. 27, 1992, now abandoned which is continuation-in-part application of Ser. No. 07/621,531, filed Dec. 3, 1990, now issued as U.S. Pat. No. 5,092,424.

The invention relates to porting in a loudspeaker system.

According to the invention, there is a port or tube for radiating acoustic energy to the region outside a loudspeaker enclosure smoothly flared at each end. The port has a lengthwise axis and is typically symmetrical about the lengthwise axis and smoothly flared at each end for substantially the entire perimeter about the lengthwise axis. The tube has a cross-sectional area that progressively decreases towards the center. According to one aspect of the invention, the port is bounded by an elliptical toroid, such that the tube length is approximately equal to the major diameter of an ellipse rotated about the port axis to form the toroid. An exemplary port according to the invention is embodied in the commercially available Bose Acoustimass® 5 series II loudspeaker system incorporated herein by reference. According to another aspect, the port is of rectangular cross section.

The tapered cross section of the flared port helps reduce turbulent airflow that might cause audible noise when radiating at high velocity levels.

Other features and advantages will become apparent from the following detailed description when read in connection with the accompanying drawing in which:

FIG. 1 is a cross section of a loudspeaker system including a flared port according to the invention; and FIGS. 2A and 2B are perspective views of another embodiment of the invention of rectangular cross section exposing the smoothly flared input end and smoothly flared output end, respectively.

A loudspeaker enclosure or cabinet 11 has multiple subchambers, $V_1$–$V_3$, and multiple passive radiators, $P_1$–$P_4$, such as ports. Woofers 12 are mounted on first dividing wall 13 which separates first internal subchamber $V_1$ from second subchamber $V_2$. Second dividing wall 11 separates subchambers $V_1$ and $V_2$ from subchambers $V_3$ and includes three passive radiators $P_1$, $P_2$, and $P_4$. Flared passive radiator $P_3$ is mounted in external wall 15 for radiating acoustic energy to the region outside the enclosure.

The invention is embodied in the commercially available ACOUSTIMASS® 5 series II bass module being manufactured and sold by the assignee of this application. This commercial embodiment has the following representative parameters:

Volume of intermediate subchamber $V_1$ is 0.00413$m^3$

Volume of end subchamber $V_2$ is 0.00657$m^3$

Volume of end subchamber $V_3$ is 0.0119$m^3$

Port tube passive radiator $P_1$ is 0.203m long by 0.044m in diameter.

Port tube passive radiators $P_2$ and $P_4$ are each 0.057m long by 0.051m in diameter.

Flared port tube passive radiator $P_3$ is 0.12m long by 0.12m in diameter at each end and 0.058m in diameter at the center bounded by the inside of a toroid of elliptical cross section. The ellipse has a major diameter substantially equal to the length of the tube.

The woofers are 14 cm diameter woofers. These parameters produce three deflection minima at 44 Hz, 80 Hz and 190 Hz and provide a frequency response characteristic having a relatively uniform response over the bass frequency range and a sharp cutoff at 30 db per octave above 200 Hz to sharply reduce the radiation of undesired harmonics through flared port $P_3$.

The tapered cross section of flared port tube $P_3$ helps reduce turbulent airflow to the region outside the enclosure that might produce audible noise when radiating at high velocity levels.

Referring to FIGS. 2A and 2B, there is shown an alternate embodiment of the invention in which the port is of rectangular cross section. Port conduit 21 has a flared inside end 22 and a flared outside end 23. Preferably, the curvature of each flared end portion is substantially the same. It may also be advantageous to have the surface of each side be defined by an ellipse having a major diameter corresponding to the length of the conduit. While this embodiment is shown as of generally rectangular cross section, it is within the principles of the invention to flare a conduit of any cross section, including a regular polygon. The particular curvature is preferably such as to enclose a volume of predetermined acoustic mass while producing inaudible noise at relatively high power levels.

It is believed to be advantageous for the port to be symmetrical about the port axis and symmetrical about a plane midway between the port ends. It is believed to be advantageous for the port cross-sectional area to be a minimum in this plane midway between the ends.

Other embodiments are within the claims.

What is claimed is:

1. A loudspeaker enclosure with at least one port for radiating acoustic energy to a region outside said enclosure and having an inside volume,
   said at least one port having an axis and characterized by predetermined acoustic mass intercoupling said inside volume and the region outside said enclosure having a smoothly flared input end within said inside volume and a smoothly flared output end adjacent to the region outside said inside volume,
   wherein said port defines a boundary between the acoustic mass therein and said inside volume,
   said boundary being defined by an ellipse having a major diameter.

2. A loudspeaker enclosure in accordance with claim 1 wherein said boundary is defined by the rotation of said ellipse about the axis of said port.

3. A loudspeaker enclosure in accordance with claim 2 wherein the length of said port corresponds to the major diameter of said ellipse.

4. A loudspeaker enclosure in accordance with claim 1 wherein said at least one port is of circular cross section.

5. A loudspeaker enclosure in accordance with claim 1 wherein said at least one port is of rectangular cross section.

6. A loudspeaker enclosure in accordance with claim 1 wherein said at least one port is symmetrical about a plane perpendicular to said axis midway between said input end and said output end.

* * * * *

US005714721C1

(12) REEXAMINATION CERTIFICATE (4709th)

United States Patent

Gawronski et al.

(10) Number: US 5,714,721 C1
(45) Certificate Issued: Jan. 7, 2003

(54) PORTING

(75) Inventors: Brian J. Gawronski, Northboro, MA (US); Gerald F. Caron, Andover, MA (US)

(73) Assignee: Bose Corporation, Framingham, MA (US)

Reexamination Request:
No. 90/006,109, Sep. 10, 2001

Reexamination Certificate for:
Patent No.: 5,714,721
Issued: Feb. 3, 1998
Appl. No.: 08/739,300
Filed: Oct. 29, 1996

( * ) Notice: This patent is subject to a terminal disclaimer.

Related U.S. Application Data

(63) Continuation of application No. 07/843,858, filed on Feb. 27, 1992, now abandoned, which is a continuation-in-part of application No. 07/621,531, filed on Dec. 3, 1990, now Pat. No. 5,092,424.

(51) Int. Cl.[7] .................................................. H05K 5/00
(52) U.S. Cl. ...................... 181/156; 181/145; 181/148; 181/199
(58) Field of Search ................................ 181/144, 145, 181/148, 150, 156, 159, 199

(56) References Cited

U.S. PATENT DOCUMENTS 1,930,757 A * 10/1933 Kirke et al. ................ 181/199
D101,684 S 10/1936 Sweeney
3,037,081 A 5/1962 Carlsson ........................ 179/1
3,547,221 A 12/1970 Hedberg ...................... 181/31
3,684,051 A 8/1972 Hopkins ...................... 181/31
3,688,864 A 9/1972 Guss ........................... 181/31
3,892,288 A 7/1975 Klayman et al. ........... 181/156
4,006,311 A 2/1977 Carlsson ........................ 179/1
4,104,610 A * 8/1978 Inoue et al. .................. 367/93
4,158,400 A * 6/1979 Vice ........................... 181/144
4,284,166 A 8/1981 Gale .......................... 181/156
4,324,313 A * 4/1982 Nakagawa .................. 181/187
4,524,845 A 6/1985 Perrigo ....................... 181/152
4,878,561 A * 11/1989 Tengstrand et al. ......... 181/144
4,893,695 A * 1/1990 Tamura et al. .............. 181/146

FOREIGN PATENT DOCUMENTS

FR 2 623 337 5/1989 ............ H01R/1/28
JP 58-121895 7/1983 ............ H04R/1/02
JP 5-122785 6/1993 ............ H04R/1/02

OTHER PUBLICATIONS

KEF Electronics, Ltd., Promotional brochure for KEF Speaker Model 104/2, 1985, (6 pages).
International Standard 5167, Global Engineering Documents, 1980, including pp. 1–5 and 20–26 (14 pages).

* cited by examiner

*Primary Examiner*—Shih-yung Hsieh

(57) ABSTRACT

A loudspeaker enclosure has an inside volume. At least one port characterized by predetermined mass intercouples the inside volume and the region outside the enclosure. Each port has a smoothly flared input end within the inside volume and smoothly flared output end adjacent to the region outside the inside volume. The port defines a boundary between the acoustic mass therein and the inside volume, the boundary typically being defined by an ellipse, and in a particular form by the rotation of an ellipse about the axis of a port. Typically, the length of the port corresponds substantially to the major diameter of the ellipse.

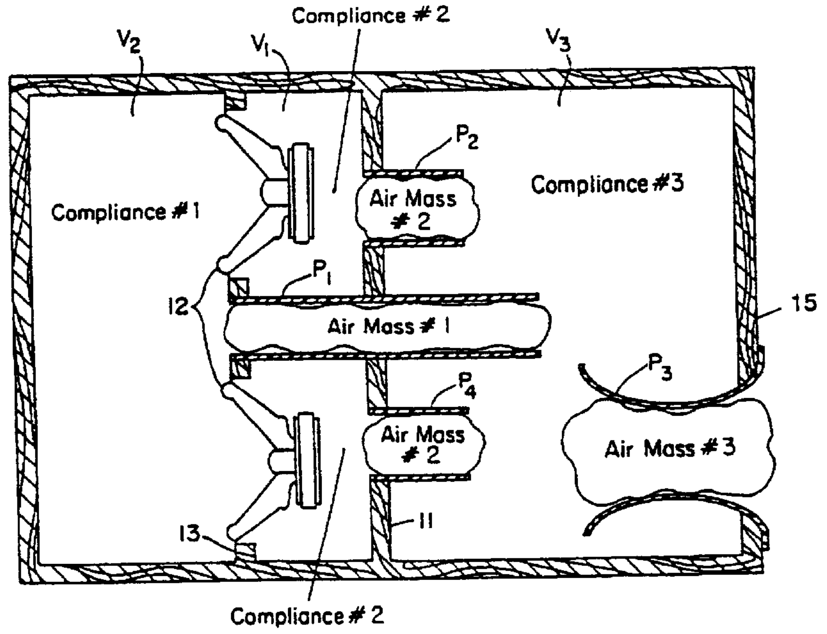

REEXAMINATION CERTIFICATE ISSUED UNDER 35 U.S.C. 307

NO AMENDMENTS HAVE BEEN MADE TO THE PATENT

Figure 1:
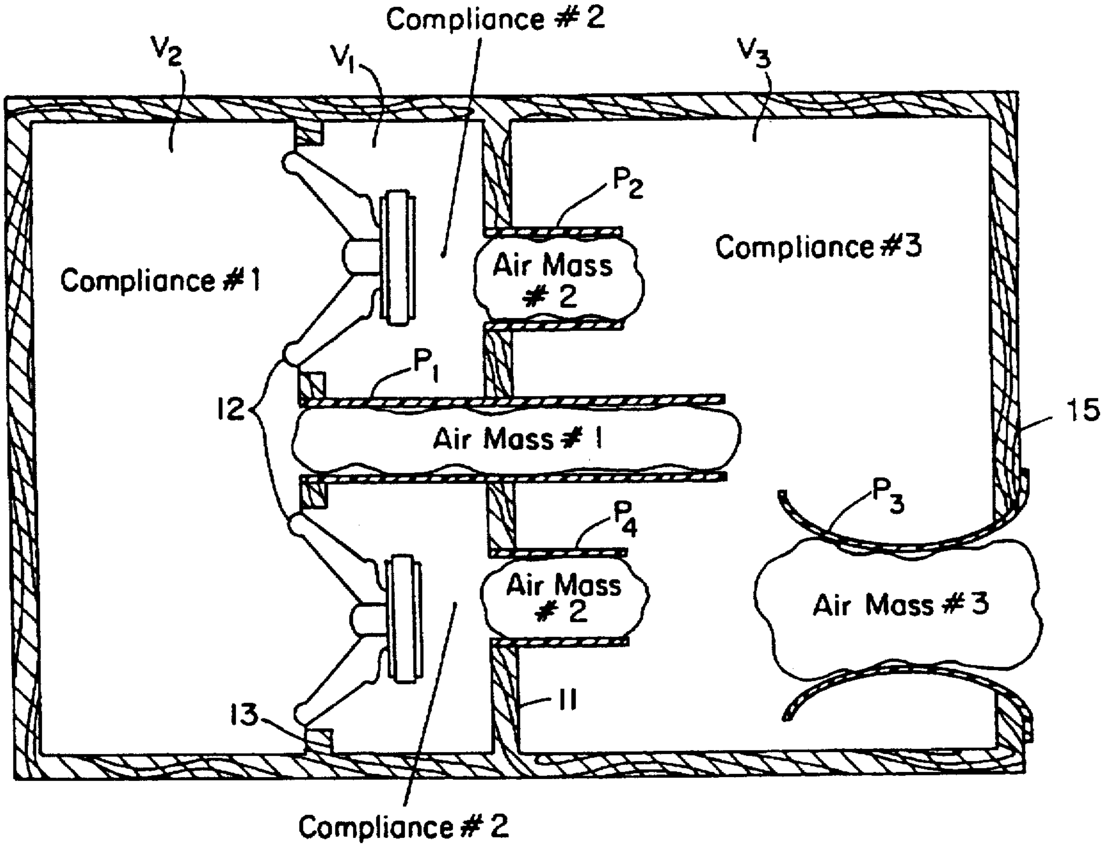
Figure 2A:
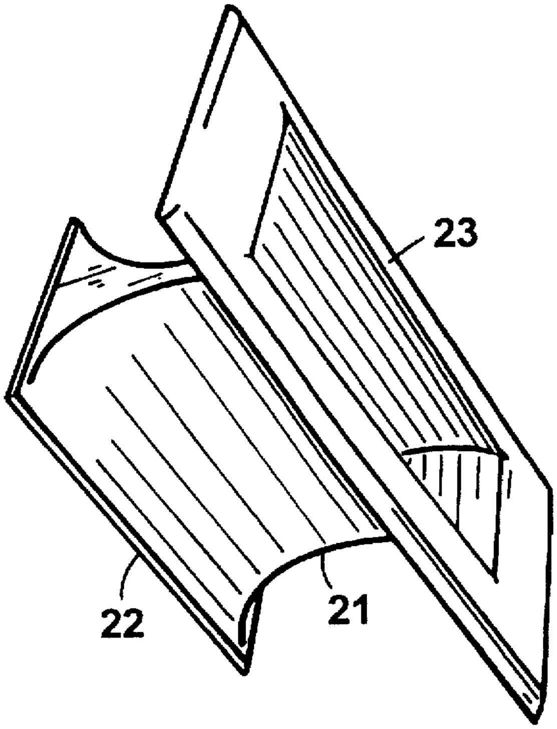
Figure 2B:
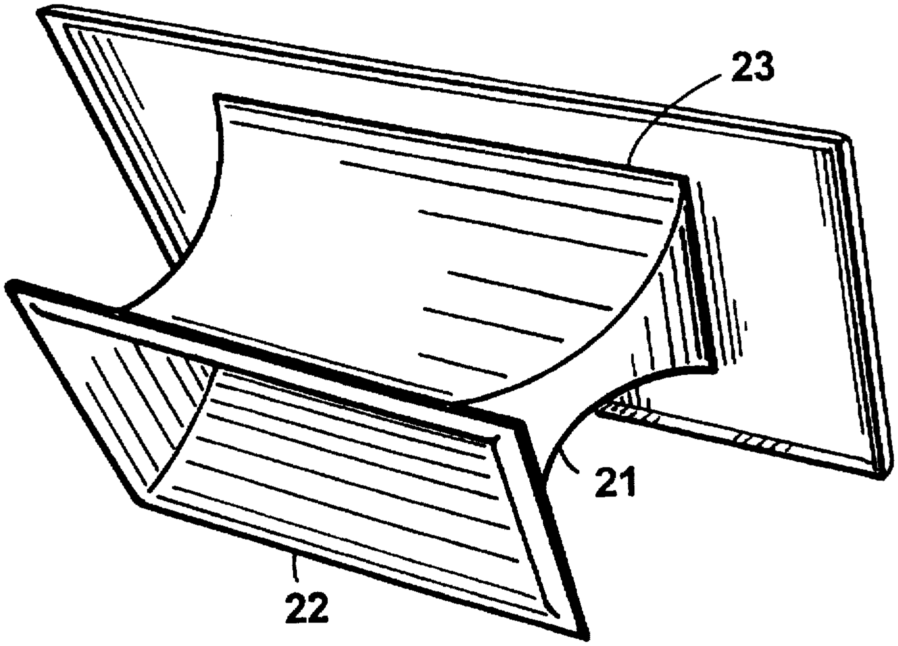

AS A RESULT OF REEXAMINATION, IT HAS BEEN DETERMINED THAT:

The patentability of claims 1–6 is confirmed.

* * * * *